United States Patent [19]

Ishii et al.

[11] 4,443,771

[45] Apr. 17, 1984

[54] POWER AMPLIFIER

[75] Inventors: Satoshi Ishii; Hirosi Koinuma, both of Tokyo, Japan

[73] Assignee: Pioneer Electronic Corporation, Tokyo, Japan

[21] Appl. No.: 329,100

[22] Filed: Dec. 9, 1981

[30] Foreign Application Priority Data

Dec. 11, 1980 [JP] Japan ................... 55-177954

[51] Int. Cl.³ .............................................. H03F 3/30
[52] U.S. Cl. ..................................... 330/297; 330/267
[58] Field of Search ................ 330/297, 263, 267, 296

[56] References Cited

U.S. PATENT DOCUMENTS 4,110,501  7/1978  Nakagaki ........................... 330/267

FOREIGN PATENT DOCUMENTS 2647916  5/1977  Fed. Rep. of Germany ...... 330/297

Primary Examiner—James B. Mullins
Assistant Examiner—G. Wan
Attorney, Agent, or Firm—Sughrue, Mion, Zinn, Macpeak & Seas

[57] ABSTRACT

In a power amplifier circuit the ends of the DC source for the class A stage are isolated from the amplifier transistors by diode. A resistor may also be connected across the class A amplifier diodes.

22 Claims, 12 Drawing Figures

POWER AMPLIFIER

BACKGROUND OF THE INVENTION

This invention relates to a power amplifier in which a class B amplifier is employed as a current source in order to improve the efficiency of the class A amplifier, and which is so designed that an unnecessarily high voltage is not applied to the class A amplifier when a problem occurs in the class B amplifier.

In order to improve the efficiency of a class A amplifier, a circuit as shown in FIG. 1 has been proposed. In FIG. 1, reference characters $A_1$ and $A_2$ designate drive stages. The drive stage $A_1$ operates to drive transistors $Q_1$ and $Q_2$ in a class A amplifier. The output of the drive stage $A_1$ is applied to the bases of the transistors $Q_1$ and $Q_2$, the emitters of which are connected to an output terminal OUT, and the output terminal OUT is grounded through a load $R_L$.

The collector of the transistor $Q_1$ is connected to a DC source $+E_2$, and the collector of the transistor $Q_1$ is connected to a DC source $-E_2$. The connecting point of the DC sources $+E_2$ and $-E_2$ is connected through a feedback circuit $\beta$ to an input terminal of the drive stage $A_2$.

An input IN is applied to the input terminals of the drive stages $A_1$ and $A_2$. The output of the drive stage $A_2$ is applied to the bases of transistors $Q_3$ and $Q_4$ which form a class B amplifier. The emitter of the transistor $Q_3$ is connected to a DC source $+E_1$, and the emitter of the transistor $Q_4$ is connected to a DC source $-E_1$.

The DC sources $+E_1$ and $-E_1$ are connected in series with each other, and the connecting point of the DC sources $+E_1$ and $-E_1$ is grounded. The collector of the transistor $Q_3$ is connected to the DC source $+E_2$; i.e., it is connected to the collector of the transistor $Q_1$. The collector of the transistor $Q_4$ is connected to the DC source $-E_2$; i.e., it is connected to the collector of the transistor $Q_2$. The voltages of the DC sources $+E_2$ and $-E_2$ are lower than those of the DC sources $+E_1$ and $-E_1$, respectively. In practice, alternating current is rectified and is then smoothed with capacitors $C_1$ and $C_2$ as shown in FIG. 2, to obtain the DC sources $+E_2$ and $-E_2$.

In FIG. 2, reference character $T_2$ designates the secondary winding of a power transformer. Both ends of the secondary winding $T_2$ are connected through diodes $D_1$ and $D_2$ to the capacitors $C_1$ and $C_2$, respectively. The capacitors $C_1$ and $C_2$ are connected in series with each other, and the connecting point of the capacitors $C_1$ and $C_2$ is connected to the center tap of the winding $T_2$.

When a problem occurs in the circuit in FIG. 1: such as when the emitter and collector of one of the transistors $Q_3$ or $Q_4$ of the class B amplifier are short-circuited, the connecting point a of the DC sources $+E_2$ and $-E_2$ is brought into contact with the other elements or the class B amplifier oscillates, then for instance a current $I_1$ flows to charge the capacitor $C_1$.

Since the rated voltage of the capacitor $C_1$ is low, the capacitor $C_1$ is over-charged in such a case. The same thing can be said to occur on the negative side.

Thus, when, in the case where the class A amplifier employs the class B amplifier as a current source, a problem occurs in the class B amplifier, then an overvoltage is applied to the capacitors $C_1$ and $C_2$ forming the DC source of the class A amplifier, thus adversely affecting the class A amplifier.

SUMMARY OF THE INVENTION

Accordingly, an object of this invention is to eliminate the above-described difficulty. More specifically, an object of the invention is to provide a power amplifier in which, even when a problem occurs in the class B amplifier, the smoothing capacitors or the like in a DC source for the class A amplifier are not affected thereby.

Briefly, this object is achieved by isolating the class A amplifier transistors from their respective DC source connections by diodes so that when the normal class A amplifier is forced to operate in a class B mode, the DC sources will be essentially isolated, and feedback to the class B stage input will be discontinued. A resistor may optionally be connected across the class A amplifier transistors for further protection.

BRIEF DESCRIPTION OF THE DRAWINGS

In the drawings:

FIGS. 4(a) through (d) are diagrams showing waveforms at various circuit points in the circuit of FIG. 3 when the power amplifier operates normally;

DETAILED DESCRIPTION OF THE INVENTION

Figure 3:
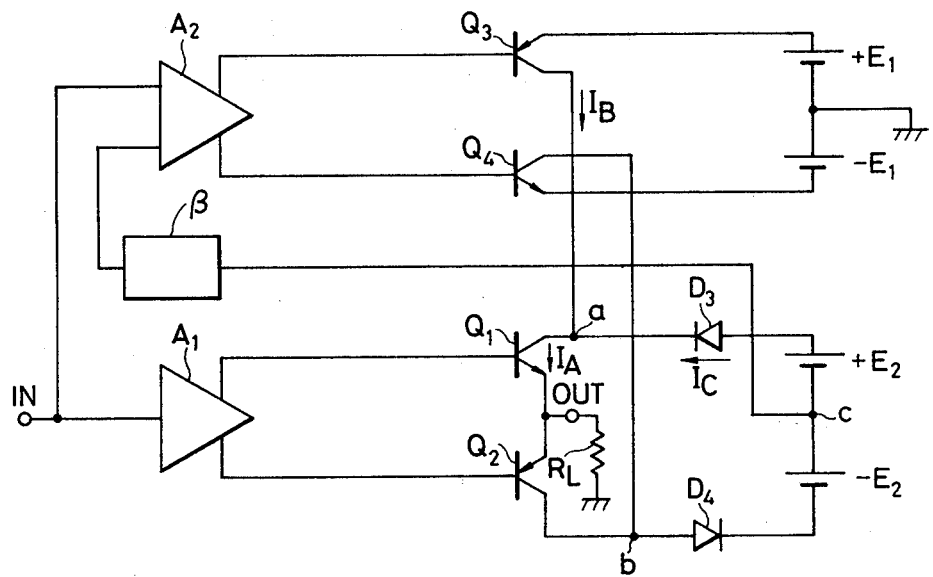
FIG. 3 is a circuit diagram showing the first example of the power amplifier according to this invention.
Figure 3:
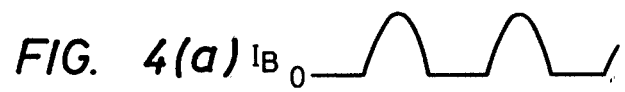
Figure 3:
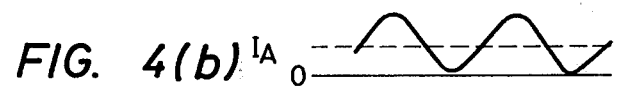
Figure 3:
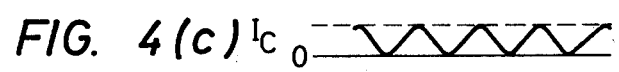

Examples of a power amplifier according to the invention will be described with reference to FIGS. 3 through 6. FIG. 3 is a circuit diagram showing the arrangement of a first example of a power amplifier of this invention. For simplification in description, in FIG. 3, those components which have been previously described with reference to FIG. 1 are designated by the same reference characters or numerals, and the following description is primarily directed to the components in FIG. 3 which are different from those in FIG. 1.

Figure 1:
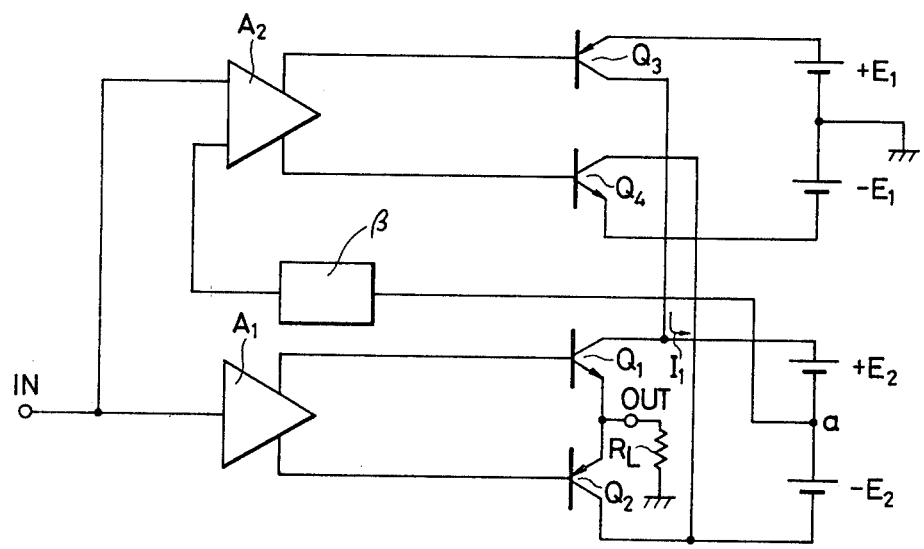
FIG. 1 is a circuit diagram of a conventional power amplifier.

As is apparent from comparison of FIG. 3 with FIG. 1, the circuit in FIG. 3 is different from that in FIG. 1 in the provision of diodes $D_3$ and $D_4$. The diode $D_3$ is connected between the positive terminal of the DC source $+E_2$ and the collector of the transistor $Q_1$ in the class A amplifier, which is connected to the collector of the transistor $Q_3$ in the class B amplifier.

The diode $D_4$ is connected between the negative terminal of the DC source $-E_2$ and the collector of the transistor $Q_2$ in the class A amplifier, which is connected to the collector of the transistor $Q_4$ in the class B amplifier.

The operation of the power amplifier thus arranged will be described with reference to waveform diagrams in FIGS. 4 and 5. The waveform diagram of FIG. 4 is for the case where the power amplifier is operating normally, and the waveform diagram of FIG. 5 is for the case where the load becomes abnormally heavy.

In the normal operation, an input is applied to the drive stages $A_1$ and $A_2$, the outputs of which are applied to the transistors $Q_1$ and $Q_2$ in the class A amplifier and the transistors $Q_3$ and $Q_4$ in the class B amplifier, respectively. Thus, the transistors $Q_1$ and $Q_2$ and the transistors $Q_3$ and $Q_4$ operate according to the amplitudes of the outputs of the drive stages $A_1$ and $A_2$.

Figure 4D:
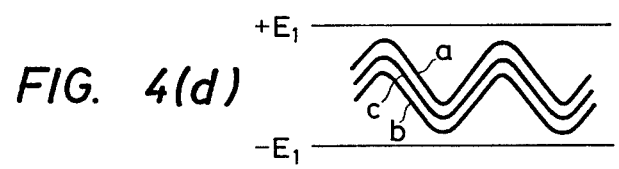

In this operation, a current $I_B$ as shown in FIG. 4(a) flows in the collector of the transistor $Q_3$ in the class B amplifier, a current $I_A$ as shown in FIG. 4(b) flows in the collector of the transistor $Q_1$ in the class A amplifier, and a current $I_C$ as shown in FIG. 4(c) flows in the diode $D_3$. A voltage waveform at the connecting point a of the collectors of the transistors $Q_1$ and $Q_3$ is as indicated by reference character a in FIG. 4(d). A voltage waveform at the connecting point b of the collectors of the transistors $Q_2$ and $Q_4$ is as indicated by reference character b in FIG. 4(d). A voltage at the connecting point c or at the output terminal OUT is as indicated by reference character c in FIG. 4(d).

As the load is increased and the class A amplifier is caused to operate in a class B amplification mode, the waveforms at the aforementioned various circuit points become as shown in FIGS. 5(a) through (d), wherein FIGS. 5(a) through (d) correspond to FIGS. 4(a) through (d), respectively.

Figure 5A:
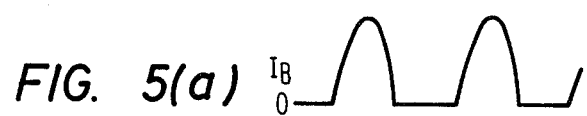
FIGS. 5(a) through (d) are diagrams showing waveforms at the various circuit point in the circuit of FIG. 3 when the operation of the class A amplifier is shifted into a class B amplifier operation.
Figure 5B:
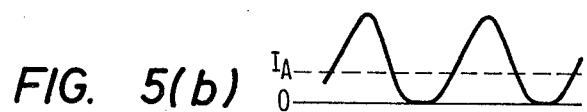
Figure 5C:
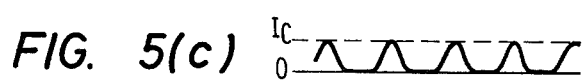
Figure 5D:
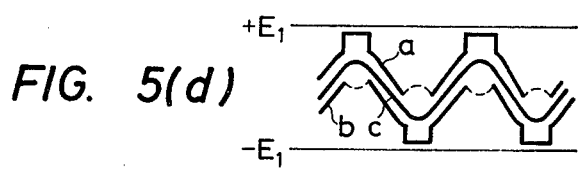

When the class A amplifier is caused to operate in class B amplification mode, then no currents are supplied to the class A amplifier from the DC sources $+E_2$ and $-E_2$; that is, the class A amplifier is effectively disconnected from the DC sources at the diodes $D_3$ and $D_4$. Thus, the application of feedback to the class B amplifier is temporarily suspended. Therefore, with a large positive signal the transistor $Q_3$ is rendered completely conductive, and with a large negative signal the transistor $Q_4$ is rendered completely conductive. Thus, the collector current $I_B$ of the transistor $Q_3$ is as shown in FIG. 5(a).

On the other hand, with the large positive signal the transistors $Q_4$ and $Q_2$ are rendered non-conductive, and with the large negative signal the transistors $Q_3$ and $Q_1$ are rendered non-conductive. Therefore, the currents $I_B$, $I_A$ and $I_C$ mentioned above become as shown in FIGS. 5(a), (b) and (c), respectively. The voltage at the connecting point c or at the output terminal OUT is as indicated by reference character c in FIG. 5(d).

Figure 2:
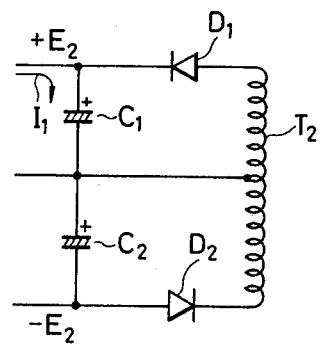
FIG. 2 is a circuit diagram showing a part of a power sorce for a class A amplifier in the conventional power amplifier and in a first example of a power amplifier according to this invention.

As is apparent from the above description, even when a problem occurs in the class B amplifier, no over-voltage is applied to the capacitors $C_1$ and $C_2$ (FIG. 2) forming the DC sources $+E_2$ and $-E_2$, and accordingly the capacitors $C_1$ and $C_2$ will never be damaged.

Figure 6:
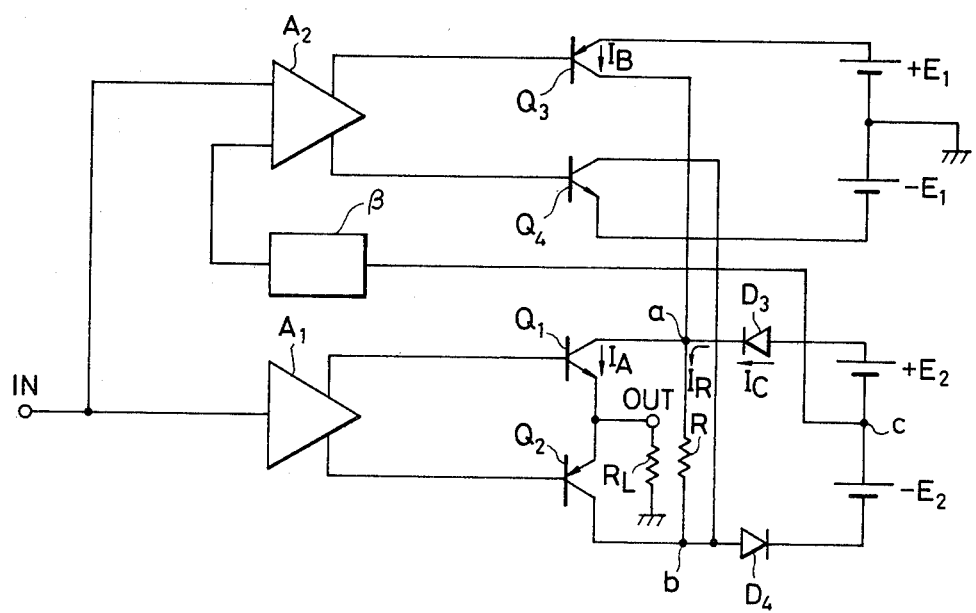
FIG. 6 is a circuit diagram showing a second example of the power amplifier according to the invention.

FIG. 6 is a circuit diagram showing a second example of the power amplifier according to the invention. The circuit shown in FIG. 6 can be obtained by connecting a resistor R between the connecting points a and b in the circuit of FIG. 3. Owing to the provision of the resistor R, a current $I_R$ flows in the resistor R at all times even when the class A amplifier is caused to operate in a class B amplification mode. Therefore, a potential slightly lower than $2E_2$ is maintained between the connecting points a and b.

In other words, the voltages at the connecting points a and b follow voltage variation at the connecting point c. Thus, there is substantially no possibility that when the connecting points a and b are released from the circuit in the example shown in FIG. 2, the transistors $Q_3$ and $Q_4$ will be rendered conductive to thus increasing the collector loss.

In summary, the circuit in FIG. 6 is advantageous in that the class A amplifier is protected from the adverse effect of a problem occurring in the class B amplifier, and lowering of the efficiency of the class B amplifier can be prevented.

As is clear from the above description, according to the invention, the diodes are inserted between the DC sources of the class A amplifier and the collectors of the transistors in the class B amplifier so that, when the operation of the class A amplifier is shifted into a class B amplifier operation as the load is increased, the supply of current from the class B amplifier to the DC sources of the class A amplifier is prevented. Thus, the capacitors forming the DC sources of the class A amplifier can be protected from damage.

What is claimed is:

1. A power amplifier, comprising:
   a class A amplifier portion having at least first and second transistors of opposite conductivity types having their emitter-collector paths connected in series, the common connection point of said first and second transistors comprising an output;
   a first DC source means having first and second terminals connected across said series connection of said first and second transistors;
   diodes coupled between said first DC source means and either end of said series connection of said first and second transistors;
   second DC source means; and
   a class B amplifier portion having at least third and fourth transistors of opposite conductivity types, said first and third transistors being connected in series between said second DC source means and said output, and said second and fourth transistors being connected in series between said second DC source means and said output, wherein said class B amplifier portion is used by said class A amplifier portion as a current source.

2. A power amplifier as claimed in claim 1, wherein said first and fourth transistors are of one conductivity type and said second and third transistors are of the other conductivity type.

3. A power amplifier as claimed in claim 2, wherein said first and fourth transistors are NPN transistors and said second DC source means having a high potential terminal coupled to the emitter of said third transistor and a low potential terminal connected to the emitter of said fourth transistors, the collectors of said third and fourth transistors being coupled to the collectors of said first and second transistors, respectively.

4. A power amplifier as claimed in any one of claims 1, 2 or 3, wherein said DC source means includes high and low potential terminals, and said diodes comprise a first diode having an anode coupled to said high potential terminal and a cathode connected to one end of said series connection and a second diode having a cathode connected to said low potential terminal and an anode connected to the other end of said series connection.

5. A power amplifier as claimed in claim 4, wherein said DC source means comprises first and second series connected capacitors.

6. A power amplifier as claimed in claim 4, further comprising a resistor coupled across said series connection of said first and second transistors, whereby when said first amplifier portion operates in a class B mode, current from said first DC source means flows through said resistor at all times.

7. A power amplifier, comprising:
  a class A amplifier portion having at least first and second transistors of opposite conductivity types having their emitter-collector paths connected in series, the common connection point of said first and second transistors comprising an output;
  a first DC source means having first and second terminals connected across said series connection of said first and second transistors;
  diodes coupled between said first DC source means and either and of said series connection of said first and second transistors;
  second DC source means;
  a class B amplifier portion having at least third and fourth transistors of opposite conductivity types, said first and third transistors being connected in series between said second DC source means and said output, and said second and fourth transistors being connected in series between said second DC source means and said output, wherein said class B amplifier portion is used by said class A amplifier portion as a current source;
  feedback means for providing a feedback signal in accordance with fluctuations in said first DC source means; and
  drive means responsive to an input signal and said feedback signal for driving said third and fourth transistors.

8. A power amplifier as claimed in claim 7, wherein said first DC source means comprises first and second potential sources connected in series, and said feedback signal is responsive to the potential of the connection point of said first and second potential sources.

9. A power amplifier as claimed in claim 8, wherein said DC source means includes high and low potential terminals, and said diodes comprise a first diode having an anode coupled to said high potential terminal and a cathode connected to one end of said series connection and a second diode having a cathode connected to said low potential terminal and an anode connected to the other end of said series connection.

10. A power amplifier as claimed in claim 9, wherein said DC source means comprises first and second series connected capacitors.

11. A power amplifier as claimed in claim 9, further comprising a resistor coupled across said series connection of said first and second transistors, whereby when said first amplifier portion operates in a class B mode, current from said first DC source means flows through said resistor at all times.

12. A power amplifier as claimed in claim 7, wherein said first and fourth transistors are of one conductivity type and said second and third transistors are of the other conductivity type.

13. A power amplifier as claimed in claim 12, wherein said DC source means includes high and low potential terminals, and said diodes comprise a first diode having an anode coupled to said high potential terminal and a cathode connected to one end of said series connection and a second diode having a cathode connected to said low potential terminal and an anode connected to the other end of said series connection.

14. A power amplifier as claimed in claim 13, wherein said DC source means comprises first and second series connected capcitors.

15. A power amplifier as claimed in claim 13, further comprising a resistor coupled across said series connection of said first and second transistors, whereby when said first amplifier portion operates in a class B mode, current from said first DC source means flows through said resistor at all times.

16. A power amplifier as claimed in claim 7, wherein said first and fourth transistors are NPN transistors and said second DC source means having a high potential terminal coupled to the emitter of said third transistor and a low potential terminal connected to the emitter of said fourth transistor, the collectors of said third and fourth transistors being coupled to the collectors of said first and second transistors, respectively.

17. A power amplifier as claimed in claim 16, wherein said DC source means includes high and low potential terminals, and said diodes comprise a first diode having an anode coupled to said high potential terminal and a cathode connected to one end of said series connection and a second diode having a cathode connected to said low potential terminal and an anode connected to the other end of said series connection.

18. A power amplifier as claimed in claim 17, wherein said DC source means comprises first and second series connected capacitors.

19. A power amplifier as claimed in claim 17, further comprising a resistor coupled across said series connection of said first and second transistors, whereby when said first amplifier portion operates in a class B mode, current from said first DC source means flows through said resistor at all times.

20. A power amplifier as claimed in claim 7, wherein said DC source means includes high and low potential terminals, and said diodes comprise a first diode having an anode coupled to said high potential terminal and a cathode connected to one end of said series connection and a second diode having a cathode connected to said low potential terminal and an anode connected to the other end of said series connection.

21. A power amplifier as claimed in claim 20, wherein said DC source means comprises first and second series connected capacitors.

22. A power amplifier as claimed in claim 20, further comprising a resistor coupled across said series connection of said first and second transistors, whereby when said first amplifier portion operates in a class B mode, current from said first DC source means flows through said resistor at all times.

* * * * *